US006835526B2

(12) United States Patent
Komatsu et al.

(10) Patent No.: US 6,835,526 B2
(45) Date of Patent: Dec. 28, 2004

(54) PHOTOSENSITIVE COMPOSITIONS

(75) Inventors: Toshio Komatsu, Yokohama (JP); Kazuyoshi Satake, Yokohama (JP); Takehiko Nitta, Yokohama (JP)

(73) Assignee: The Inctec, Inc., Yokohama (JP)

( * ) Notice: Subject to any disclaimer, the term of this patent is extended or adjusted under 35 U.S.C. 154(b) by 278 days.

(21) Appl. No.: 10/091,314

(22) Filed: Mar. 6, 2002

(65) Prior Publication Data

US 2002/0192591 A1 Dec. 19, 2002

(30) Foreign Application Priority Data

| | | |
|---|---|---|
| Mar. 7, 2001 | (JP) | 2001-063258 |
| Jun. 28, 2001 | (JP) | 2001-196080 |
| Aug. 10, 2001 | (JP) | 2001-243652 |

(51) Int. Cl.[7] ........ G03F 7/00
(52) U.S. Cl. ........ 430/270.1
(58) Field of Search ........ 399/302; 430/7, 430/270.1

(56) References Cited

U.S. PATENT DOCUMENTS

| | | | | | |
|---|---|---|---|---|---|
| 4,339,528 | A | * | 7/1982 | Goldman | 430/323 |
| 4,339,529 | A | * | 7/1982 | Goldman | 430/323 |
| 4,499,176 | A | * | 2/1985 | Curtis et al. | 430/253 |
| 4,707,433 | A | * | 11/1987 | Ogawa | 430/289.1 |
| 5,059,509 | A | * | 10/1991 | Mino et al. | 430/257 |
| 5,807,657 | A | * | 9/1998 | Kikuchi et al. | 430/287.1 |
| 5,948,592 | A | * | 9/1999 | Umehara et al. | 430/270.1 |
| 5,955,226 | A | * | 9/1999 | Matsuda et al. | 430/25 |
| 5,989,649 | A | * | 11/1999 | Itou et al. | 427/468 |
| 6,010,824 | A | * | 1/2000 | Komano et al. | 430/281.1 |
| 6,265,116 | B1 | * | 7/2001 | Uchikawa et al. | 430/7 |

FOREIGN PATENT DOCUMENTS

JP 58-30746 * 2/1983 ........ G03C/1/00

OTHER PUBLICATIONS

English language translation of 58–030746.*

* cited by examiner

*Primary Examiner*—Amanda Walke
(74) *Attorney, Agent, or Firm*—Oblon, Spivak, McClelland, Maier & Neustadt, P.C.

(57) ABSTRACT

Photosensitive compositions each comprises (A) at least one sensitizer selected from the group consisting of bichromates and chromates, (B) a water-soluble high-molecular substance, such as casein, polyvinyl alcohol, gelatin or fish glue, (C) at least one sensitivity improver selected from the group consisting of polyhydric alcohols and ethers; and (D) water.

19 Claims, No Drawings

PHOTOSENSITIVE COMPOSITIONS

BACKGROUND OF THE INVENTION a) Field of the Invention

This invention relates to photosensitive compositions of the bichromate/water-soluble high-molecular substance, and more specifically to photosensitive compositions each of which has high sensitivity and is excellent in improving the productivity of a production process of a product by use of the photosensitive compositions.

b) Description of the Related Art

As bichromate-containing photosensitive compositions are soluble in water, permit easy handling and are available at relatively low price, they have been used widely to date as resist materials in the manufacture of machine plates, such as letterpress plates, deep-etch offset plates and screen printing plates, and also in the photoetching work of shadow masks for color cathode-ray tubes, lead frames and etched metal products.

These bichromate-containing photosensitive compositions, however, involve a problem that due to their low sensitivity to exposure light sources of high-energy radiation such as ultraviolet rays, they require long-time exposure, a high irradiation intensity of high-energy radiation and a high dose upon use, resulting in a problem that the productivity of printing press plates or photoetched products cannot be increased. Especially in the mass production of shadow masks by use of a bichromate-containing photosensitive composition of the casein or polyvinyl alcohol type, exposure requires substantial time and high-energy radiation of large irradiation energy.

SUMMARY OF THE INVENTION

An object of the present invention is, therefore, to provide a photosensitive composition which, while retaining resolution comparable with the conventional bichromate-containing photosensitive compositions, posses excellent sensitivity, enables shortening the time of exposure and decreasing the exposure of high-energy radiation, and permits an improvement in the productivity of a product.

With a view to solving the above-described problems and achieving the object, the present inventors have proceeded with an extensive investigation. As a result, it has been found that additional inclusion of a polyhydric alcohol and/or an ether in an aqueous solution of a particular water-soluble high-molecular substance, said aqueous solution containing a bichromate and/or a chromate, makes it possible to bring about extremely high sensitivity compared with the conventional bichromate-containing photosensitive compositions while retaining a resolution as high as the resolutions of these conventional photosensitive compositions and hence to shorten the time of exposure, to decrease the exposure of high-energy radiation and to improve the productivity of printing press plates or photoetched products.

The above-described object can be achieved by the present invention to be described hereinafter. Described specifically, the present invention provides a composition comprising:

(A) at least one sensitizer selected from the group consisting of bichromates and chromates;

(B) a water-soluble high-molecular substance;

(C) at least one sensitivity improver selected from the group consisting of polyhydric alcohols and ethers; and (D) water.

The photosensitive composition according to the present invention, while retaining resolution comparable with those available from the conventional chromate-containing photosensitive compositions, has extremely high sensitivity and makes it possible to shorten the time of an exposure step, to decrease the exposure of high-energy radiation and to improve the productivity of printing press plates and photoetched products.

DETAILED DESCRIPTION OF THE INVENTION AND PREFERRED EMBODIMENTS

The present invention will next be described in further detail based on certain preferred embodiments. The photosensitive composition according to the present invention features the addition of a polyhydric alcohol and/or an ether in an appropriate proportion to an aqueous solution of a particular water-soluble high-molecular substance, said aqueous solution containing a bichromate and/or a chromate, in order to provide the aqueous solution with improved sensitivity.

Illustrative of the water-soluble high-molecular substance (B) for use in the present invention are casein, polyvinyl alcohol, gelatin and fish glue. Examples of the casein can include acid caseins such as HCl casein, lactic casein and $H_2SO_4$ casein, caseinates such as ammonium caseinate and sodium caseinate, and mixtures thereof, all of which have been obtained using casein having a number average molecular weight of from 25,000 to 35,000, preferably from 26,000 to 30,000. In addition, degraded casein obtained by partially hydrolyzing casein with rennin can also be used.

As the above-described acid caseins, those produced by known production processes can be used. For example, when a 0.5 N acid is added at 20° C. to skimmed milk to lower its pH to 4.5 and steam is then added directly to the resulting mixture to heat the same to 55° C., casein precipitates and coagulates. The thus-obtained solid matter is separated to obtain casein. To obtain lactic casein, on the other hand, 0.1 to 0.5 wt. % of a lactic acid bacteria starter is added to skimmed milk and the resulting mixture is subjected to fermentation at 22 to 26° C. Then, lactic casein precipitates and coagulates at pH 4.6 and is separated.

The above-described acid caseins are each usable in the present invention by dissolving it at 10 to 20 wt. % in an aqueous solution of an inorganic or organic alkali. Examples of the inorganic alkali employed in the aqueous alkaline solution can include sodium hydroxide, potassium hydroxide, carbonates, bicarbonates and borates. Examples of the organic alkali, on the other hand, can include amines such as methylamine, ethylamine, propylamine, isopropylamine, dimethylamine, trimethylamine, cyclopropylamine, and tertiary amines.

The above-described ammonium caseinate and sodium caseinate are each used as an aqueous solution in the present invention by dissolving it by itself at 10 to 15 wt. % in water. Ammonium caseinate is a product obtained by mixing one of the above-described acid caseins with water, adding aqueous ammonia, heating the thus-prepared mixture to dissolve the acid casein, and reacting the acid casein and the ammonia.

Illustrative of the polyvinyl alcohol for use in the present invention are polyvinyl alcohols used in known PVA-base photosensitive compositions, cation-modified polyvinyl alcohols, and anion-modified polyvinyl alcohols. Preferred polyvinyl alcohols and modified polyvinyl alcohols have an average polymerization degree of from 300 to 3,000 and a saponification degree of from 70.0 to 99.0 mol %. More preferred polyvinyl alcohols and modified polyvinyl alcohols have an average polymerization degree of from 500 to 1,000 and a saponification degree of from 80.0 to 88.0 mol %. They can be produced by known processes. For use in the present invention, they are also available under trade names such as "Kuraray Poval 105", "Kuraray Poval 205", "Kuraray Poval 217" and "Kuraray Poval 224" from Kuraray Co., Ltd. and under trade names such as "Gosenol GL-05" and "Gosenol GM-14" from The Nippon Synthetic Chemical Industry Co., Ltd.

If such polyvinyl alcohol or modified polyvinyl alcohol has an average polymerization degree higher than the above-described upper limit, the resulting photosensitive composition may be provided with an excessively high viscosity so that upon its application to a base material for a printing press plate or a base material to be subjected to photoetching, it may exhibit reduced coating properties and may result in non-uniform coating. If the average polymerization degree of such polyvinyl alcohol or modified polyvinyl alcohol is lower than the above-described lower limit, the resulting photosensitive composition may be provided with an unduly low viscosity so that it may not be able to provide a resist of sufficient thickness. If the saponification degree of such polyvinyl alcohol is lower than the above-described lower limit, the polyvinyl alcohol may have a potential problem in that its solubility in water may be too low. These polyvinyl alcohols and modified polyvinyl alcohols can each be used by formulating it into a 5 to 20 wt. % aqueous solution.

The cationic polyvinyl alcohol can be obtained, for example, by copolymerizing vinyl acetate with a cationic monomer and then subjecting the resulting copolymer to hydrolysis. Examples of the cationic monomer can include acrylates and methacrylates each of which contains a tertiary or quaternary amino group, N-substituted methacrylamides, vinylpyridine, vinylpyridine quaternary ammonium salt, and vinylimidazole.

Illustrative of the anionic polyvinyl alcohol are those obtained by introducing anion groups such as carboxyl groups, sulfonic acid groups or phosphoric acid groups. Examples can include carboxyl-modified polyvinyl alcohols obtained by reacting dibasic acids—such as maleic acid, fumaric acid, phthalic acid, oxalic acid, malonic acid, succinic acid and adipic acid—or anhydrides thereof with polyvinyl alcohol, respectively; and sulfonic-acid-modified polyvinyl alcohols obtained by copolymerizing ethylene-sulfonic acid, allyl-sulfonic acid, methallylsulfonic acid and 2-acrylamido-2-methylpropanesulfonic acid or esters or salts thereof with vinyl acetate, respectively, and then saponifying the resulting copolymers.

The above-described cationic or anionic polyvinyl alcohols can be obtained from Kuraray Co., Ltd. under the trade names of "C-408", "C-506", "C-318", "C-118", "CM-318" and the like as cationic polyvinyl alcohols and under the trade names of "KL-118", "KL-318", "KL-506", "KM-118", "KM-618" and the like as anionic polyvinyl alcohols.

Illustrative of the gelatin for use in the present invention is a product obtained by treating collagen with an alkali or acid in a manner known per se in the art and containing 2 wt. % or less of ash, 0.5 wt. % or less of fats and oils, and 0.5 wt. % or less of insoluble matter. This product is used in the present invention after formulating it into a 5 to 20 wt. % aqueous solution. As the fish glue, on the other hand, commercial fish glue which is in a liquid form having a solid content of 50 wt. % is used in the present invention after formulating it into a 5 to 20 wt. % aqueous solution.

The bichromate and/or chromate used as photosensitive compound(s) (or sensitizer(s)) in the present invention can be those employed in conventional photosensitive compositions of the chromate type. Examples can include ammonium bichromate, sodium bichromate, potassium bichromate, ammonium chromate, sodium chromate, and potassium chromate.

The polyhydric alcohol which mainly characterizes the present invention is a compound containing two or more hydroxyl groups in a molecule. Illustrative are α-glycols such as ethylene glycol, 1,2-propylene glycol, 1,2-butylene glycol, 2,3-butylene glycol and 1,2-hexanediol; β-glycols such as neopentyl glycol, 2-methyl-1,3-propanediol, 2-methyl-2,4-pentanediol, 3-methyl-1,3-butanediol, 2-ethyl-1,3-hexanediol, 2,2-diethyl-1,3-propanediol, 2,2,4-trimethyl-1,3-butanediol, 2-butyl-2-ethyl-1,3-propanediol, trimethylene glycol and 1,3-butylene glycol; and other diols such as 1,4-butanediol, 1,5-pentanediol, 1,6-hexanediol, 1,7-heptanediol, diethylene glycol, triethylene glycol, tetraethylene glycol, polyethylene glycol, dipropylene glycol and tripropylene glycol.

Illustrative of a compound having three or more hydroxyl groups in a molecule are trihydric alcohols glycerin, specifically glycerin and substituted glycerin such as butane-1,2,3-triol, 2-methylpropane-1,2,3-triol, pentane-2,3,4-triol, 2-methylbutane-1,2,3-triol, hexane-2,3,4-triol and 2-ethylbutane-1,2,3-triol; other polyhydric alcohols such as diglycerin, triglycerin, pentaerythritol and sorbitol; and mixtures thereof.

Among the above-described polyhydric alcohols, preferred are those having a molecular weight or weight average molecular weight not higher than 400, and being either liquid or solid at room temperature, and being readily soluble in water such as deionized water or alkaline water. As especially preferred polyhydric alcohols, ethylene glycol, propylene glycol, dipropylene glycol, trimethylene glycol, diethylene glycol, polyethylene glycol and glycerin can be exemplified.

Examples of the ethers can include those having a molecular weight or weight average molecular weight not higher than 400 and a boiling point higher than 100° C., specifically aromatic ethers such as anisole and diphenyl ether; monoalkyl ethers of ethylene glycol, such as monomethyl, monoethyl, monoisopropyl, monobutyl and isoamyl ethers of ethylene glycol: monoalkyl ethers of diethylene glycol, such as monomethyl, monoethyl, monoisopropyl and monobutyl ethers of diethylene glycol; monoalkyl ethers of triethylene glycol, such as monomethyl, monoethyl, monobutyl, monoisobutyl, monohexyl and monododecyl ethers of triethylene glycol; monoalkyl ethers of alkylene glycols such as 1,4-butanediol monohexyl ether, 1,6-pentanediol monohexyl ether and propylene glycol monoethyl ether; glycol alkyl ethers such as polyethylene glycol monomethyl ether and polyethylene glycol monoethyl ether; and mixtures thereof.

Among the above-described ethers, preferred are ethylene glycol monomethyl ether, ethylene glycol monobutyl ether, diethylene glycol monomethyl ether, diethylene glycol monoethyl ether, diethylene glycol monobutyl ether, triethylene glycol monobutyl ether, triethylene glycol monoisobutyl ether, dipropylene glycol monomethyl ether, polyethylene glycol monomethyl ether, and propylene glycol monoethyl ether.

The above-described polyhydric alcohol and ether may preferably have a molecular weight or weight average molecular weight not higher than 400. A molecular weight higher than the upper limit results in a photosensitive composition with reduced coating properties to metallic base materials such as base materials for printing press plates or base materials to be subjected to photoetching, thereby developing potential problems that uniform resist films may be hardly available and that, when resist films are developed with water subsequent to exposure to high-energy radiation such as ultraviolet rays, blurs may be developed.

As the above-described polyhydric alcohol and/or ether is used to provide the resulting photosensitive composition with improved sensitivity, it is an essential requirement that a portion of the polyhydric alcohol and/or ether still remains in a formed resist film at the time point that the resist film is exposed through a desired photomask by an ultraviolet ray source (wavelength: 350 to 450 nm) such as a xenon lamp or an extra-high pressure mercury vapor lamp. The remaining amount may preferably amount to 5 to 20 wt. % based on the film of the photosensitive composition. If the remaining amount exceeds the upper limit, the resulting resist film may be reduced in drying characteristics, thereby developing a potential problem that tack may be developed to cause adhesion of a photomask. If the remaining amount is smaller than the lower limit, the sensitivity-improving effect may not be sufficiently obtained.

Concerning the polyhydric alcohol and/or ether, no particular limitation is imposed on drying conditions upon forming a resist film on the base material with an aqueous solution of the photosensitive composition. Nonetheless, when a coating of the composition is dried by heating it, for example, in an atmosphere of from 50 to 90° C. to drive off water, it is necessary that the resulting resist film is tack free and the polyhydric alcohol and/or ether partly remains in the resist film. For this purpose, the polyhydric alcohol and/or ether may preferably have a boiling point higher than 100° C. A boiling point of 100° C. or lower involves a potential problem that the polyhydric alcohol and/or ether (C) may not remain in a sufficient amount in the resulting resist film, thereby failing to provide the resist film with sufficiently improved sensitivity.

The above-described improvement in the sensitivity of a resist film by the polyhydric alcohol and/or ether (C) is achieved presumably as will be described next. In the course of a photochemical reaction that hexavalent chromium atoms of acidic chromic acid ions, which are photoactive species of the bichromate and/or chromate, are photoreduced into trivalent chromium atoms and a reaction that the trivalent chromium atoms subsequently form coordinate bonds with the water-soluble high-molecular substance (B), which contains unshared electron pairs, to crosslink the water-soluble high-molecular substance (B), the polyhydric alcohol and/or ether (C) is assumed to promote the crosslinking gelation by promoting the generation of acidic chromic acid ions and the photo-reduction owing to its humectant effect.

The polyhydric alcohol and/or ether (C) may be added to an aqueous solution of the water-soluble high-molecular substance (B) or as an alternative, may be added later to the photosensitive composition formed of the bichromate and/or chromate (A) and the aqueous solution of the water-soluble high-molecular substance (B), and no particular limitation is imposed on the manner of its addition. The proportion of the component (C) may range from 5 to 40 parts by weight, preferably from 5 to 20 parts by weight per 100 parts by weight of the water-soluble high-molecular substance (B).

A proportion of the polyhydric alcohol/ether (C) greater than the upper limit has a potential problem in that, when the resulting photosensitive composition is coated on a metallic base material such as a base material for a printing press plate or a base material to be subjected to photoetching and is then dried into a resist film, tack may be developed on the resist film and, upon exposing the resist film by using an ultraviolet ray source such as an extra-high pressure mercury vapor lamp, the resist may adhere to an exposure photomask or the resist film may have sensitivity increased by 16 times or more compared with the sensitivity of conventional bichromate-containing photosensitive compositions free of the polyhydric alcohol and/or ether (C) and the sensitivity of the resist film may be hardly adjustable. A proportion of the polyhydric alcohol/ether (C) smaller than the lower limit may not be able to provide a resist film with sensitivity improved to a desired level. The preferred proportion of the polyhydric alcohol/ether (C) may be in such a range that, when the sensitivity of a resist film formed from a conventional bichromate-containing photosensitive composition free of the component (C) is assumed to be 1, the sensitivity of a resist film obtained from the resulting photosensitive composition ranges approximately from 1.4 to 16.

Described specifically, the preferred sensitivity can be defined such that, when a resist film is formed with a thickness of from 5 to 10 $\mu$m on a base material for a printing press plate or a base material to be subjected to photoetching and is then exposed by an ultraviolet ray source (wavelength: 350 to 450 nm) through a "Kodak Photographic Step Tablet No. 2" (trade name; product of Eastman Kodak Company), an exposure required to allow Step 5 (density: 0.65, transmission: 22.39%) to remain after the exposure process is in a range of from 500 to 5,000 mJ/cm$^2$, preferably from 1,000 to 4,000 mJ/cm$^2$. An exposure (dose) greater than the upper limit requires a large dose of ultraviolet rays like conventional bichromate-containing photosensitive compositions. This means that the sensitivity-improving effect is low. An exposure smaller than the lower limit, on the other hand, makes it difficult to control the level of exposure.

In a preferred embodiment of the present invention, a preservative can be added to the photosensitive composition according to the present invention as needed to prevent any deleterious effect on the sensitivity by rotting or microorganism growth. As the preservative, a known preservative is usable. Examples of the preservative can include phenol compounds such phenol, 4-chloro-3-methylphenol, 3-methyl-4-isopropylphenol, monochloro-2-phenylphenol, parachlorophenol, and orthophenylphenol; triazine compounds such as hexahydrotriazine; chlorohexidine gluconate compounds; isothiazolone compounds such as 5-chloro-2-methyl-isothiazolone, 4-chloro-2-methyl-3-isothiazolone, 2-methyl-3-isothiazolone, 2-n-octyl-3-isothiazolone, 2-ethyl-3-isothiazolone, and 4,5-dichloro-2-cyclohexyl-3-isothiazolone; benzisothiazolone compounds such as 1,2-benzisothiazolone, N-methyl-1,2-benzisothiazolone, 2-octyl-4-chloro-1,2-benzisothiazolone, and 2-octyl-4,7-dichloro-1,2-benzisothiazolone; and mixtures thereof. The preferred proportion of the preservative may range from 0.001 to 0.1 part by weight per 100 parts by weight of the photosensitive composition according to the present invention.

In another preferred embodiment of the present invention, a conventionally-known nonionic surfactant can be added in a range, which does not adversely affect the object of the present invention, as needed to improve the coating applicability and leveling property of the photosensitive composition of the present invention to a base material, such as a base material for a printing press plate or a base material to be subjected to photoetching, and to impart anti-foaming property to the photosensitive composition. Examples of the nonionic surfactant can include polyoxyethylene alkyl ethers, polyoxyethylene sorbitan esters, polyoxyethylene alkyl esters, polyoxyethylene alkyl amines, polyoxyethylene alkyl phenyl ethers, and polyoxyethylene alkyl amides. The proportion of the nonionic surfactant may preferably range from 0.1 to 0.2 part by weight per 100 parts by weight of the photosensitive composition according to the present invention.

The photosensitive composition according to the present invention is furnished as an aqueous solution (10 to 20 wt. %) in which an aqueous solution of the water-soluble high-molecular substance such as casein, polyvinyl alcohol, gelatin or fish glue, the photosensitive compound composed of a bichromate and/or a chromate, and the polyhydric alcohol and/or ether have been added. As the proportions of the respective components, it is preferred to add 100 parts by weight of the water-soluble high-molecular substance (B), 5 to 40 parts by weight of the polyhydric alcohol and/or ether (C), and 5 to 20 parts by weight of the bichromate and/or chromate (A).

A description will next be made of an application example of the photosensitive composition according to the present invention. On a degreased metallic base material such as abase material for a printing press plate or a base material to be subjected to photoetching, the photosensitive composition according to the present invention is coated to a dry thickness of from 5 to 10 $\mu$m by a known coating method, for example, spin coating, dip coating, flow coating, roll coating, curtain coating, blade coating, spray coating or slit coating. By a drying method such as hot-air drying or far infrared drying, water is caused to evaporate in an atmosphere of from 50 to 90° C. The coating is dried to such an extent that the coating becomes tack free and the polyhydric alcohol and/or ether (C) partly remains (5 to 20 wt. %) in the coating. As a result, a resist film is formed.

The thus-formed resist film is next exposed for 5 to 50 seconds (as opposed to 20 to 100 seconds in the case of conventional photosensitive compositions free of such a polyhydric alcohol and/or ether) to an exposure (dose) of from 500 to 5,000 $mJ/cm^2$ (405 to 436 nm) through a desired photomask by an ultraviolet ray source such as an extra-high pressure mercury vapor lamp or a metal halide lamp. Among exposure conditions, the radiation intensity and cumulative exposure can be appropriately set depending upon the thickness of each resist film and the kind of a radiation source. The photosensitive composition according to the present invention is used with its sensitivity adjusted to a range of approximately from 1.4 to 16 times as much as those of conventional bichromate-containing photosensitive compositions which are free of the component (C). A sensitivity higher than the upper limit of the above range makes it difficult to adjust exposure conditions, while a sensitivity lower than the lower limit of the above range means low sensitivity-improving effect and cannot increase the productivity.

Subsequent to the above-described exposure, the resist film is developed with warm water (purified water, hard water, soft water or the like) of from 20 to 50° C., preferably of from 40 to 50° C. by a known developing method, for example, spraying, paddling or dipping, preferably by spraying. To improve the adhesion of the resist film to a metallic base material such as a base material for a printing press plate or a base material to be subjected to photoetching and also to improve the etching resistance of the resist film to an etching solution, the resist film may be hardened subsequent to its development by dipping the resist film in a 3 wt. % aqueous solution of chromic anhydride and then subjecting the thus-dipped resist film to heat treatment at 120 to 150° C.

As an example of an etching process making use of the resist film developed by the above-described procedure, a metallic base material [a cold rolled, low-carbon aluminum killed steel made of iron as a principal component, an alloy made of iron and nickel as principal components (64% Fe-36% Ni Invar), a copper alloy, a nickel alloy or a stainless steel] on which an etching mask making use of casein or polyvinyl alcohol (in other words, a developed resist film) can be subjected to etching treatment by using a known acidic etching solution, for example, a 40 to 50 wt. % aqueous solution of nitric acid, hydrochloric acid, ferric chloride, cupric chloride or the like, preferably ferric chloride. The etching treatment can be conducted at 40 to 80° C. with the above-described etching solution by a known method such as spraying or dipping. No particular limitation is imposed on the etching conditions, but spraying is preferred because this etching method does not cause much lateral etching and generally achieve a high etch rate. Ultrasonic irradiation or the like can be applied in combination as needed.

Subsequent to the above-described etching, the etching mask is peeled off by a known method such as spraying or dipping with an aqueous solution of an inorganic or organic alkali such as sodium hydroxide, potassium hydroxide or an organic amine. The aqueous solution is used by heating it to 60 to 100° C. An oxidizing agent such as sodium hypochlorite or potassium periodate may be added to the aqueous solution as needed. Rinsing is then conducted to obtain an etched metal product.

The present invention will next be described specifically based on Examples and Comparative Examples, in which all designations of "parts or part" and "%" are on a weight basis. It is to be noted that the photosensitive composition according to the present invention is by no means limited to the following Examples.

EXAMPLES 1–7

Photosensitive Compositions K1–K7

$H_2SO_4$ casein (10 parts) was suspended in water (88 parts). Borax (1 part) was added to the suspension, followed by stirring under heating at 80° C. for 15 minutes in a closed atmosphere to prepare a homogeneous aqueous casein solution. Ammonium bichromate (1 part) was added to the thus-obtained aqueous casein solution, and the resulting mixture was thoroughly stirred into an aqueous solution. To the aqueous solution, a polyhydric alcohol a1 (1 part) was added as indicated below under Example 1 in Table 1. The mixture was thoroughly stirred into a homogeneous mixture to prepare an invention photosensitive composition K1 (Example 1). To aqueous solutions prepared in a similar manner, polyhydric alcohols and/or ethers were added, respectively, as indicated below under Examples 2 to 7 in Table 1 to prepare invention photosensitive compositions K2 to K7 (Examples 2 to 7).

EXAMPLES 8–14

Photosensitive Compositions K8–K14

Ammonium caseinate (11 parts) was added to water (88 parts). The resulting mixture was stirred under heating at 80° C. for 15 minutes in a closed atmosphere to prepare a homogeneous aqueous casein solution. Ammonium bichromate (1 part) was added to the thus-obtained aqueous casein solution, and the resulting mixture was thoroughly stirred into an aqueous solution. To the aqueous solution, a polyhydric alcohol a1 (1 part) was added as indicated below under Example 8 in Table 2. The mixture was thoroughly stirred into a homogeneous mixture to prepare an invention photosensitive composition K8 (Example 8). To aqueous solutions prepared in a similar manner as described above, polyhydric alcohols and/or ethers were added, respectively, as indicated below under Examples 9 to 14 in Table 2 to prepare invention photosensitive compositions K9 to K14 (Examples 9 to 14).

EXAMPLES 15–20

Photosensitive Compositions P1–P6

Polyvinyl alcohol (saponification degree: 88.0 mol %, average polymerization degree: 500; 10 parts) was dissolved in water (90 parts). To the resultant aqueous solution ammonium bichromate (1 part) was added, and the resulting mixture was thoroughly stirred into an aqueous solution. To the aqueous solution, a polyhydric alcohol a4 (2 parts) was added as indicated below under Example 15 in Table 3. The mixture was thoroughly stirred into a homogeneous mixture to prepare an invention photosensitive composition P1 (Example 15). To aqueous solutions prepared in a similar manner as described above, polyhydric alcohols were added, respectively, as indicated below under Examples 16 to 20 in Table 3 to prepare invention photosensitive compositions P2 to P6 (Examples 16 to 20).

EXAMPLES 21–26

Photosensitive Compositions P7–P12

In a similar manner as in Examples 15–20 except that the polyvinyl alcohol was changed to polyvinyl alcohol having a saponification degree of 88.0 mol % and an average polymerization degree of 300, invention photosensitive compositions P7–P12 described in Table 4 were prepared.

EXAMPLES 27–32

Photosensitive Compositions P13–P18

In a similar manner as in Examples 15–20 except that the polyvinyl alcohol was changed to polyvinyl alcohol having a saponification degree of 98.0 mol % and an average polymerization degree of 500, invention photosensitive compositions P13–P18 described in Table 5 were prepared.

EXAMPLE 33

Photosensitive Composition P19

Cation-modified polyvinyl alcohol ("C-408", trade name; product of Kuraray Co., Ltd.; 10 parts) was dissolved in water (90 parts). To the resultant aqueous solution ammonium bichromate (1 part) was added, and the resulting mixture was thoroughly stirred into an aqueous solution. To the aqueous solution, glycerin (2 parts) was added. The thus-obtained mixture was thoroughly stirred into a homogeneous mixture to prepare an invention photosensitive composition P19.

EXAMPLE 34

Photosensitive Composition P20

Anion-modified polyvinyl alcohol ("KL-118", trade name; product of Kuraray Co., Ltd.; 10 parts) was dissolved in water (90 parts). To the resultant aqueous solution ammonium bichromate (1 part) was added, and the resulting mixture was thoroughly stirred into an aqueous solution. To the aqueous solution, glycerin (2 parts) was added. The thus-obtained mixture was thoroughly stirred into a homogeneous mixture to prepare an invention photosensitive composition P20.

EXAMPLE 35

Photosensitive Composition G1

Fish glue (60 parts) was dispersed in water (40 parts) To the resultant aqueous solution ammonium bichromate (3 parts) was added, and the resulting mixture was thoroughly stirred into an aqueous solution. To the aqueous solution, glycerin (2 parts) was added. The thus-obtained mixture was thoroughly stirred into a homogeneous mixture to prepare an invention photosensitive composition G1.

EXAMPLE 36

Photosensitive Composition H1

Acid-treated gelatin (11 parts) was dispersed in water (88 parts). To the resultant aqueous solution ammonium bichromate (1 part) was added, and the resulting mixture was thoroughly stirred into an aqueous solution. To the aqueous solution, glycerin (2 parts) was added. The thus-obtained mixture was thoroughly stirred into a homogeneous mixture to prepare an invention photosensitive composition H1.

Comparitive Examples 1–9

Comparative Photosensitive Compositions Z1–Z9

Comparative photosensitive compositions Z1–Z9 were prepared in a similar manner as in Examples 1 and 8 except for the omission of the propylene glycol, in a similar manner as in Examples 15, 21 and 27 except for the omission of the diethylene glycol, and in a similar manner as in Examples 33, 34, 35 and 36 except for the omission of the glycerin, respectively.

TABLE 1

| | Example | | | | | | |
|---|---|---|---|---|---|---|---|
| | 1 | 2 | 3 | 4 | 5 | 6 | 7 |
| Composition | K1 | K2 | K3 | K4 | K5 | K6 | K7 |
| Polyhydric alcohol and/or ether [Added amount in part(s)] | a1 (1) | a3 (1) | a4 (3) | a5 (3) | e1 (3) | e2 (3) | a1/e1 (1/3) |

TABLE 2

| | Example | | | | | | |
|---|---|---|---|---|---|---|---|
| | 8 | 9 | 10 | 11 | 12 | 13 | 14 |
| Composition | K8 | K9 | K10 | K11 | K12 | K13 | K14 |
| Polyhydric alcohol and/or ether [Added amount in part(s)] | a1 (1) | a3 (1) | a4 (3) | a5 (3) | e1 (3) | e2 (3) | a1/e1 (1/3) |

TABLE 3

| | Example | | | | | |
|---|---|---|---|---|---|---|
| | 15 | 16 | 17 | 18 | 19 | 20 |
| Composition | P1 | P2 | P3 | P4 | P5 | P6 |
| Polyhydric alcohol [Added amount in part(s)] | a4 (2) | a1 (1) | a2 (1) | a6 (2) | a5 (2) | a7 (2) |

TABLE 4

| | Example | | | | | |
|---|---|---|---|---|---|---|
| | 21 | 22 | 23 | 24 | 25 | 26 |
| Composition | P7 | P8 | P9 | P10 | P11 | P12 |
| Polyhydric alcohol [Added amount in part(s)] | a4 (2) | a1 (1) | a2 (1) | a6 (2) | a5 (2) | a7 (2) |

TABLE 5

| | Example | | | | | |
|---|---|---|---|---|---|---|
| | 27 | 28 | 29 | 30 | 31 | 32 |
| Composition | P13 | P14 | P15 | P16 | P17 | P18 |
| Polyhydric alcohol [Added amount in part(s)] | a4 (2) | a1 (1) | a2 (1) | a6 (2) | a5 (2) | a7 (2) |

In Table 1, Table 2, Table 3, Table 4 and Table 5, a1 to a7 and e1 to e2 indicate the following polyhydric alcohols and ethers, respectively.

a1: propylene glycol, a2: trimethylene glycol, a3: dipropylene glycol, a4: diethylene glycol, a5: polyethylene glycol, a6: ethylene glycol, a7: glycerin, e1: ethylene glycol monomethyl ether, e2: diethylene glycol monomethyl ether.

Instead of the above-described polyhydric alcohols and/or ethers, it is possible to use, as ethers, glycol ethers such as ethylene glycol monobutyl ether, diethylene glycol monoethyl ether, diethylene glycol mono(n-butyl) ether, triethylene glycol mono(n-butyl) ether, triethylene glycol mono(i-butyl) ether, polyethylene glycol monomethyl ether, propylene glycol monoethyl ether and dipropylene glycol monomethyl ether.

Using the photosensitive compositions of the respective Examples and Comparative Examples, degreased metal substrates (64% Fe-36% Ni, 150 μm) were coated by a spin coater to give a dry film thickness of 5 μm, and using a hot-air dryer, water was caused to evaporate in an atmosphere of from 50 to 90° C. to such an extent that no tack remained on the coatings, thereby preparing resist films. With respect to the individual resist films, their sensitivities were ranked by the following measuring method.

Measuring Method of Sensitivity Exposure

The resist film on each metal substrate was exposed by an extra-high pressure mercury vapor lamp (365 nm) through a "Kodak Photographic Step Tablet No. 2" (density: 0.05 to 3.05, number of steps: 21) to determine an exposure required to allow Step 5 to remain after the exposure process. The ranking results are shown in Table 6 to Table 11.

TABLE 6

| | Example | | | | | | | Comp. Ex. |
|---|---|---|---|---|---|---|---|---|
| | 1 | 2 | 3 | 4 | 5 | 6 | 7 | 1 |
| Composition | K1 | K2 | K3 | K4 | K5 | K6 | K7 | Z1 |
| Exposure to give Step 5 as step sensitivity ($mJ/cm^2$) | 3,000 | 3,000 | 1,000 | 3,000 | 2,000 | 2,000 | 3,000 | 8,000 |

TABLE 7

| | Example | | | | | | | Comp. Ex. |
|---|---|---|---|---|---|---|---|---|
| | 8 | 9 | 10 | 11 | 12 | 13 | 14 | 2 |
| Composition | K8 | K9 | K10 | K11 | K12 | K13 | K14 | Z2 |
| Exposure to give Step 5 as step sensitivity ($mJ/cm^2$) | 3,000 | 3,000 | 1,000 | 3,000 | 2,000 | 2,000 | 3,000 | 8,000 |

TABLE 8

| | Example | | | | | | Comp. Ex. |
|---|---|---|---|---|---|---|---|
| | 15 | 16 | 17 | 18 | 19 | 20 | 3 |
| Composition | P1 | P2 | P3 | P4 | P5 | P6 | Z3 |
| Exposure to give Step 5 as step sensitivity ($mJ/cm^2$) | 500 | 4,000 | 2,000 | 4,000 | 500 | 300 | 8,000 |

TABLE 9

| | Example | | | | | | Comp. Ex. |
|---|---|---|---|---|---|---|---|
| | 21 | 22 | 23 | 24 | 25 | 26 | 4 |
| Composition | P7 | P8 | P9 | P10 | P11 | P12 | Z4 |
| Exposure to give Step 5 as step sensitivity (mJ/cm$^2$) | 1,000 | 5,000 | 3,000 | 5,000 | 1,000 | 800 | 10,000 |

TABLE 10

| | Example | | | | | | Comp. Ex. |
|---|---|---|---|---|---|---|---|
| | 27 | 28 | 29 | 30 | 31 | 32 | 5 |
| Composition | P13 | P14 | P15 | P16 | P17 | P18 | Z5 |
| Exposure to give Step 5 as step sensitivity (mJ/cm$^2$) | 500 | 4,000 | 2,000 | 4,000 | 1,000 | 500 | 8,000 |

TABLE 11

| | Example | | | | Comparative Example | | | |
|---|---|---|---|---|---|---|---|---|
| | 33 | 34 | 35 | 36 | 6 | 7 | 8 | 9 |
| Composition | P19 | P20 | G1 | H1 | Z6 | Z7 | Z8 | Z9 |
| Exposure to give Step 5 as step sesitivity (mJ/cm$^2$) | 2,000 | 2,000 | 3,000 | 4,000 | 8,000 | 8,000 | 10,000 | 12,000 |

This application claims the priority of Japanese Patent Application 2001-63258 filed Mar. 7, 2001, the priority of Japanese Patent Application 2001-196080 filed Jun. 28, 2001, and the priority of Japanese Patent Application 2001-243652 filed Aug. 10, 2001, all of which are incorporated herein by reference.

What is claimed is:

1. A photosensitive composition comprising:

(A) at least one sensitizer selected from the group consisting of bichromates and chromates;

(B) a water-soluble high-molecular substance;

(C) at least one sensitivity improver selected from the group consisting of polyhydric alcohols and ethers; and (D) water.

2. A photosensitive composition according to claim 1, wherein said at least one sensitivity improver (C) is contained in a proportion of from 5 to 40 parts by weight per 100 parts by weight of said water-soluble high-molecular substance.

3. A photosensitive composition according to claim 1 or 2, wherein said at least one sensitivity improver (C) is contained in a proportion such that, when a photosensitive film is formed using said photosensitive composition, said at least one sensitivity improver (C) remains in a range of from 5 to 20 wt. % in said film.

4. A photosensitive composition according to claim 1 or 2, which forms a photosensitive film an exposure of which, said exposure being required to give a step sensitivity of Step 5 when exposed at a thickness of 5 $\mu$m to ultraviolet rays through a "Sensitivity-Measuring Kodak Photographic Step Tablet No. 2" (density: 0.05 to 3.05, number of steps: 21), is from 500 to 5,000 mJ/cm$^2$.

5. A photosensitive composition according to claim 1 or 2, wherein said water-soluble high molecular substance (B) is at least one substance selected from the group consisting of casein, polyvinyl alcohol, gelatin and fish glue.

6. A photosensitive composition according to claim 5, wherein said water-soluble high molecular substance (B) is casein, and said casein is selected from the group consisting of acid casein, ammonium caseinate and sodium caseinate.

7. A photosensitive composition according to claim 5, wherein said water-soluble high molecular substance (B) is polyvinyl alcohol, and said polyvinyl alcohol is selected from the group consisting of polyvinyl alcohol, cationic polyvinyl alcohol and anionic polyvinyl alcohol each of which has an average polymerization degree of from 300 to 3,000 and a saponification degree of from 70.0 to 99.0 mol %.

8. A photosensitive composition according to claim 5, wherein said water-soluble high molecular substance (B) is gelatin, and said gelatin is selected from the group consisting of acid-treated gelatin and alkali-treated gelatin.

9. A photosensitive composition according to claim 1 or 2, wherein each of said polyhydric alcohols and ethers has a molecular weight or weight average molecular weight not higher than 400.

10. A photosensitive composition according to claim 1 or 2, wherein each of said polyhydric alcohols and ethers has a boiling point higher than 100° C.

11. A photosensitive composition according to claim 1 or 2, wherein said at least one sensitivity improver comprises at least one polyhydric alcohol selected from the group consisting of ethylene glycol, propylene glycol, dipropylene glycol, trimethylene glycol, diethylene glycol, polyethylene glycol, and glycerin.

12. A photosensitive composition according to claim 1 or 2, wherein said at least one sensitivity improver comprises at least one ether selected from the group consisting of ethylene glycol monomethyl ether, ethylene glycol monobutyl ether, diethylene glycol monomethyl ether, diethylene glycol monobutyl ether, triethylene glycol monobutyl ether, triethylene glycol monoisobutyl ether, dipropylene glycol monomethyl ether, polyethylene glycol monomethyl ether, and propylene glycol monoethyl ether.

13. A photosensitive composition according to claim 1 or 2, further comprising a preservative.

14. A photosensitive composition according to claim 1 or 2, further comprising a nonionic surfactant.

15. A photosensitive composition according to claim 1 or 2, wherein (C) contains at least one polyhydric alcohol.

16. A photosensitive composition according to claim 15, wherein (C) contains at least one polyhydric alcohol selected from the group consisting of propylene glycol, diethylene glycol, and glycerin.

17. A photosensitive composition according to claim 1 or 2, wherein (C) contains at least one ether.

18. A method of forming a resist film on a substrate, comprising applying the photosensitive composition of claim 1 or 2 to the substrate and drying the composition.

19. A method of preparing the photosensitive composition of claim 1 or 2, comprising combining (A), (B), (C), and (D).

* * * * *